United States Patent
Donolo et al.

(10) Patent No.: US 10,848,092 B2
(45) Date of Patent: Nov. 24, 2020

(54) ELECTRIC MOTOR PROTECTION USING STATOR CURRENT AND VOLTAGE MEASUREMENTS

(71) Applicant: Schweitzer Engineering Laboratories, Inc., Pullman, WA (US)

(72) Inventors: Marcos A. Donolo, Pullman, WA (US); Jay Hartshorn, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 329 days.

(21) Appl. No.: 15/801,488

(22) Filed: Nov. 2, 2017

(65) Prior Publication Data

US 2018/0062552 A1 Mar. 1, 2018

Related U.S. Application Data

(63) Continuation-in-part of application No. 15/059,091, filed on Mar. 2, 2016, now Pat. No. 9,917,545, which is a continuation-in-part of application No. 14/033,269, filed on Sep. 20, 2013, now Pat. No. 10,054,641.

(60) Provisional application No. 62/417,994, filed on Nov. 4, 2016.

(51) Int. Cl.
| | |
|---|---|
| *H02P 1/50* | (2006.01) |
| *H02P 23/08* | (2006.01) |
| *H02P 29/60* | (2016.01) |
| *G01R 31/34* | (2020.01) |
| *H02H 7/08* | (2006.01) |
| *H02P 1/26* | (2006.01) |
| *G01R 19/25* | (2006.01) |
| *G01R 19/175* | (2006.01) |

(52) U.S. Cl.
CPC ............ *H02P 23/08* (2013.01); *G01R 31/343* (2013.01); *H02H 7/0805* (2013.01); *H02P 1/50* (2013.01); *H02P 29/60* (2016.02); *G01R 19/175* (2013.01); *G01R 19/2513* (2013.01); *H02P 1/26* (2013.01); *H02P 2203/09* (2013.01)

(58) Field of Classification Search
CPC ........ H02P 29/0241; H02P 23/26; H02P 1/26; H02P 1/50; H02P 2203/09; H02P 23/08; G01R 19/175; G01R 19/2513; G01R 31/343; H02H 7/0805
USPC ...... 318/490, 798, 807; 324/765.01; 361/30; 700/177; 702/58, 60, 64, 75, 115, 182, 702/185
See application file for complete search history.

(56) References Cited

U.S. PATENT DOCUMENTS

| | | | | |
|---|---|---|---|---|
| 4,088,934 A | * | 5/1978 | D'Atre | B60L 15/025 318/802 |
| 4,158,163 A | * | 6/1979 | Eriksen | H02P 27/06 318/798 |
| 4,419,619 A | * | 12/1983 | Jindrick | H02M 3/33515 307/31 |

(Continued)

*Primary Examiner* — John E Breene
*Assistant Examiner* — Jeffrey P Aiello
(74) *Attorney, Agent, or Firm* — Richard M. Edge

(57) ABSTRACT

Monitoring conditions of an electric motor using stator current and voltage signals from power supplied to the motor is disclosed herein. The stator voltage and current signals may be used to calculate instantaneous power values which may be used to calculate slip. The slip may be used to monitor for a locked rotor condition during startup of the motor. The slip value may be used to provide thermal protection to the electric motor.

16 Claims, 13 Drawing Sheets

(56) References Cited

U.S. PATENT DOCUMENTS

| | | | | |
|---|---|---|---|---|
| 4,926,105 | A * | 5/1990 | Mischenko | H02P 21/06 318/800 |
| 5,539,601 | A * | 7/1996 | Farag | H02H 6/005 361/23 |
| 5,548,197 | A * | 8/1996 | Unsworth | G01P 3/48 318/729 |
| 6,008,618 | A * | 12/1999 | Bose | H02P 21/34 318/800 |
| 9,151,802 | B2 * | 10/2015 | Donolo | H02P 29/0241 |
| 9,395,722 | B2 * | 7/2016 | Krata | G05B 23/027 |
| 2003/0015988 | A1 * | 1/2003 | Giuseppe | H02P 21/26 318/727 |
| 2005/0218906 | A1 * | 10/2005 | Younsi | G01R 31/346 324/551 |
| 2008/0165456 | A1 * | 7/2008 | Ganev | H02P 29/02 361/23 |
| 2008/0300827 | A1 * | 12/2008 | Lu | G01R 31/343 702/182 |
| 2009/0228224 | A1 * | 9/2009 | Spanier | G01R 22/10 702/60 |
| 2010/0060227 | A1 * | 3/2010 | Zocholl | H02H 7/0816 318/778 |
| 2010/0169030 | A1 * | 7/2010 | Parlos | G01H 1/00 702/58 |
| 2011/0309620 | A1 * | 12/2011 | Fujino | F03D 7/0204 290/44 |
| 2012/0318060 | A1 * | 12/2012 | Ruby | G01P 15/125 73/514.32 |
| 2014/0191697 | A1 * | 7/2014 | Mao | G01R 31/346 318/490 |

\* cited by examiner

ELECTRIC MOTOR PROTECTION USING STATOR CURRENT AND VOLTAGE MEASUREMENTS

RELATED APPLICATION

This application claims the benefit under 35 U.S.C. § 119(e) to U.S. Provisional Application No. 62/417,994, filed on 4 Nov. 2016, naming Marcos A. Donolo, Angelo D'Aversa, Subhash C. Patel, Vinod K. Yedidi, Jianchun Qin, and Jay Hartshorn as inventors, and titled "Electric Motor Protection Using Stator Current and Voltage Measurements"; and claims benefit as a Continuation-in-Part of U.S. Non-Provisional application Ser. No. 15/059,091, filed 2 Mar. 2016, naming Marcos A. Donolo, Angelo D'Aversa, Subhash C. Patel, Vinod K. Yedidi, and Jianchun Qin as inventors; which claims benefit as a Continuation-in-Part of U.S. Non-Provisional application Ser. No. 14/033,269, filed 20 Sep. 2013, naming Marcos A. Donolo as inventor, each of which are hereby incorporated by reference herein in their entireties.

TECHNICAL FIELD

This disclosure relates to using stator current and voltage measurements to monitor synchronization of a motor. This disclosure also relates to monitoring synchronization of a synchronous motor during startup. This disclosure also relates to monitoring and protecting a synchronous motor for locked rotor conditions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electric motors are used in many industrial and utility processes to convert electrical energy into mechanical energy useful in a process. Typically, electric motors may be induction motors or synchronous motors. Induction motors generally include a stator with windings in electrical communication with an alternating current ("AC") electric power source such that a rotating magnetic field is produced by electric current through the stator windings, as well as a rotor induction windings wherein an electrical current is induced by the rotating magnetic field. The rotor is caused to rotate due to the rotating magnetic field of the stator and a resultant magnetic field from the induced current in the rotor windings. Because torque generation depends on a difference between the rotational speed of the stator's magnetic field and the rotor's mechanical rotational speed, induction motors exhibit some degree of slip in operation. Slip may be referred to as a ratio of the difference between synchronous speed (a speed at which the rotor rotates at a frequency equal to the rotating magnetic field frequency of the stator) and the operating speed, to the synchronous speed. For a slip of 1, the rotor frequency is zero. For a slip of zero, the rotor rotates synchronously with the magnetic field induced by the stator. After startup, and depending on the attached load, induction motors may operate from around 5% slip to around 0.5% slip.

Synchronous motors similarly include a stator with windings in electrical communication with an AC electric power source such that a rotating magnetic field is produced by current through the stator windings, as well as a rotor. However, the rotor of a synchronous electric motor is magnetized by non-excited magnetization (e.g. permanent magnets) or excited magnetization using a direct current ("DC") through windings of the rotor. Because the magnetic field of the rotor is not induced by the rotating magnetic field of the stator, the rotor is capable of operating synchronously with the rotating magnetic field of the stator. That is, in operation after startup, synchronous motors may operate at a slip value of 0%.

Figure 1:
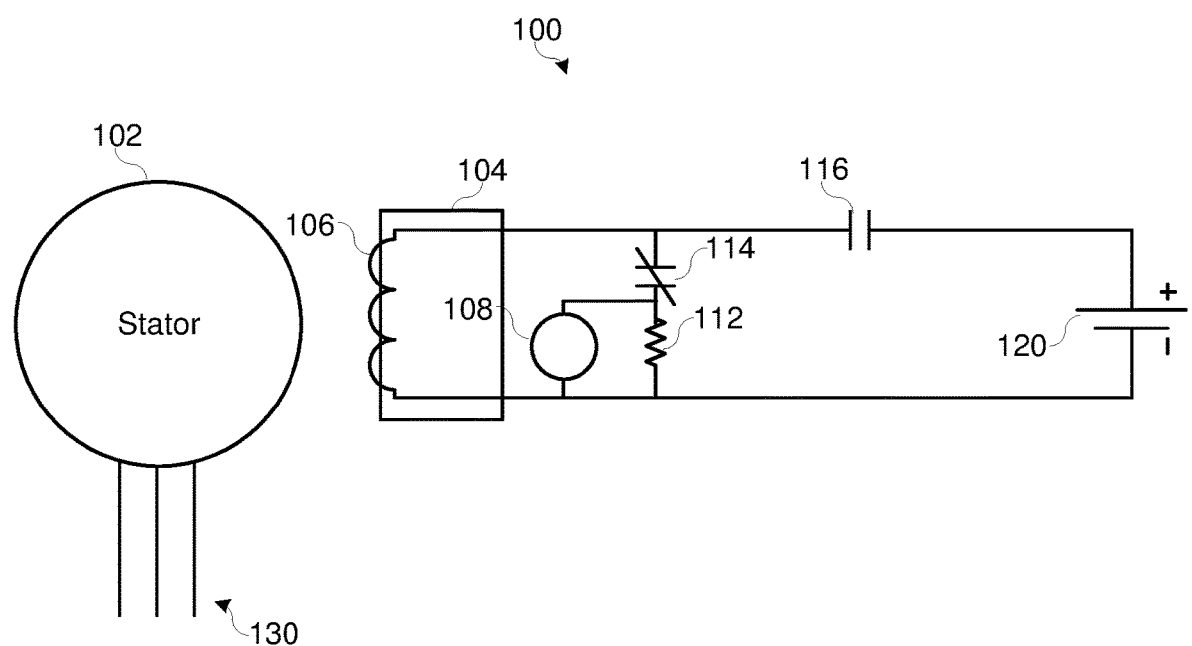
FIG. 1 is a block diagram of a synchronous motor and field winding electric supply circuitry.

Certain synchronous motors may not be capable of starting from standstill in synchronous mode. The inertia of the rotor may be too great for the rotor to follow the rotating magnetic field of the stator. Accordingly, synchronous motors may be configured to start in an induction mode and later reconfigured to synchronous mode. FIG. 1 illustrates an electrical block diagram of a synchronous motor 100 capable of being started as an induction motor and subsequently reconfigured as a synchronous motor. As briefly described above, the rotor 104 of a synchronous motor 100 may include windings 106 in electrical communication with a DC electric power source 120 to induce a magnetic field in the windings 106 of the rotor 104, that is stationary with respect to the rotor 104. These windings 106 may be disconnected from the DC power source 120 used to induce the permanent magnetic field by opening switch 116, and instead shorted using a discharge resistor 112 by closing switch 114. With the shorted windings 106, the motor 100 may act as an induction motor, with a current being induced in the field windings 106 of the rotor by the magnetic field produced by the stator windings. The stator 102 may include windings in electrical communication with an AC electric power source such as the illustrated 3-phase AC electric power source 130. After the motor 100 is started in induction mode, the motor may be reconfigured to operate in synchronous mode.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

Returning now to FIG. 1, at a certain point, the motor 100 should be reconfigured from induction startup mode to synchronous mode by disconnecting discharge resistor 112 by opening switch 114, and connecting DC electric power source 120 by closing switch 116. Thus, the field windings 106 would be reconfigured from induction windings (where the current therethrough is induced by the magnetic field from the stator windings) to windings receiving power from the DC power source 120, resulting in a magnetic field that is stationary with respect to the rotor 104.

In various motors, the reconfiguration may take place a certain predetermined time after startup. The predetermined time may be calculated based on the longest possible start time. That is, at startup a timer may be started. Once the timer expires, switch 114 may be opened and switch 116 may be closed.

In other various motors, a rotational frequency of the rotor may be monitored. When the rotational frequency of the rotor approaches the synchronous frequency switch 114 may be opened and switch 116 may be closed. Rotational frequency of the rotor may be monitored using a voltage across the discharge resistor 112. A voltage measurement device 108 across the discharge resistor 112 may be used to monitor the voltage across the discharge resistor 112. The voltage across the discharge resistor 112 may be monitored for zero-crossings, which may then be used to determine the rotational frequency of the rotor using Equation 1:

$$F_r = 100 \frac{FN - \frac{1}{2\Delta t}}{FN} \quad\quad 1$$

where:
$F_r$ is the rotational frequency of the rotor;
FN is the nominal frequency of the motor; and,
$\Delta t$ is the time between two consecutive zero crossing of the voltage monitored by the voltage measurement device 108 across the discharge resistor.

Using Equation 1, once $F_r$ approaches a predetermined threshold, the system may reconfigure to synchronous operation. The predetermined threshold may be around 95%.

According to various embodiments disclosed herein, motor synchronization may be monitored without using voltage across a discharge resistor. Thus, according to these embodiments, no additional hardware is needed to monitor slip beyond hardware typically used to monitor the motor. Further, a synchronous motor may be monitored during startup for proper reconfiguration from an induction mode to a synchronous mode when synchronization reaches a predetermined threshold. Synchronization may refer to a degree of synchronization between the rotational frequency of the rotor and the nominal frequency of the motor. In one embodiment, synchronization may be measured using slip. In another embodiment, synchronization may be measured as a ratio of the rotational frequency of the rotor to the nominal frequency of the motor. That is, when synchronization reaches a predetermined threshold, the synchronous motor may be reconfigured from induction mode to synchronous mode during startup.

Reconfiguration from induction mode during startup to synchronous mode may include removing the discharge resistor from the field winding circuit and introducing a DC source to the field winding circuit. The DC source provides current through the field windings, thus producing the magnetic field used for the synchronous motor. One method of accomplishing the removal of the discharge resistor and introduction of the DC source is once synchronization has reached a predetermined threshold, switch 114 may be opened, disconnecting the discharge resistor 112 from the field winding circuit, and switch 116 may be closed such that DC source 120 is introduced to the field winding circuit.

Figure 2:
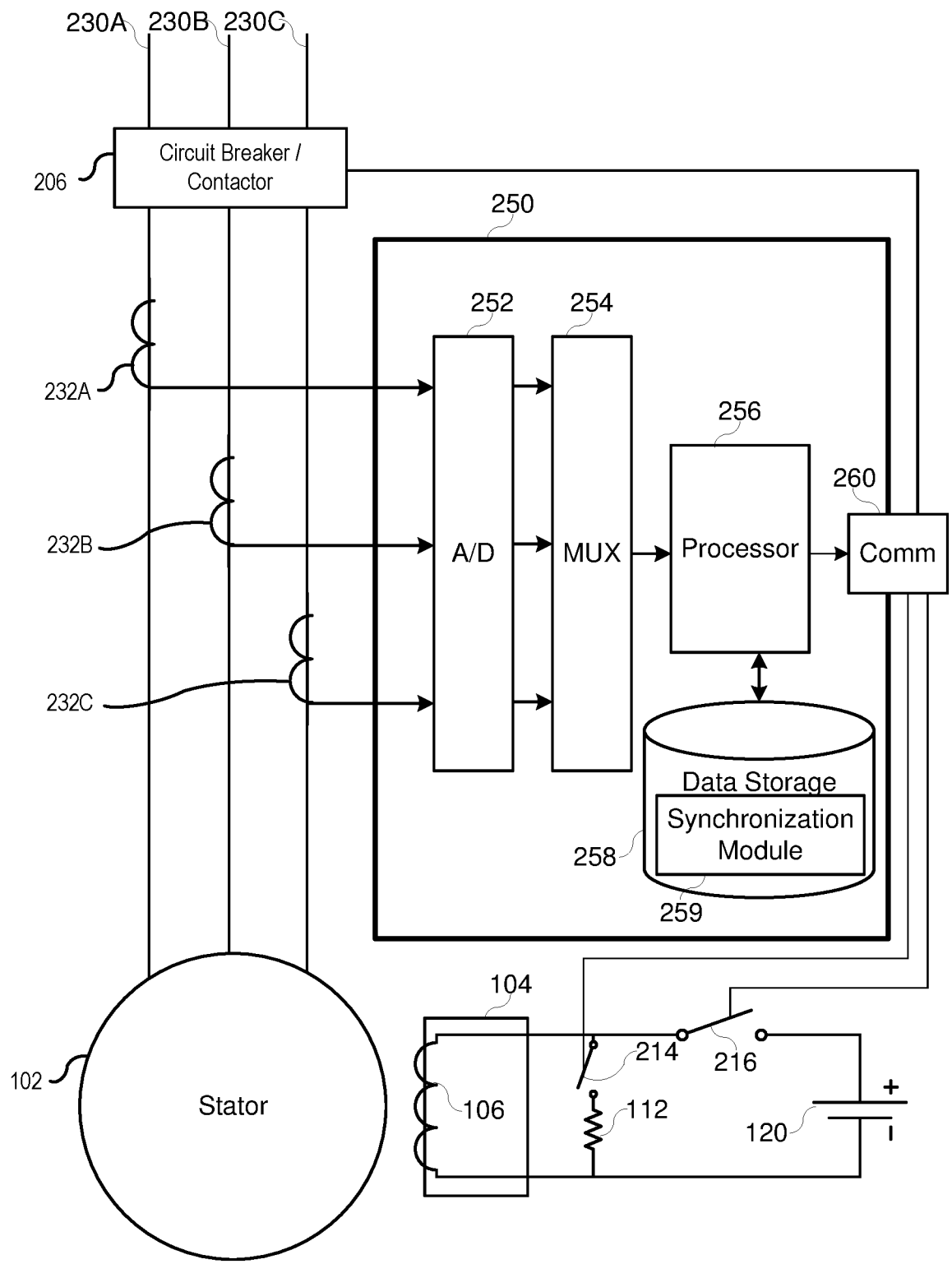
FIG. 2 illustrates a functional block diagram of an intelligent electronic device monitoring a motor.

FIG. 2 illustrates one particular embodiment of an apparatus and system according to the present disclosure. As with FIG. 1, a three phase electric motor that includes a stator 202 and a rotor 204 is monitored by an intelligent electronic device ("IED") 250 which receives current signals from the current to the motor using current transformers ("CTs") 232A, 232B, and 232C. IED 250 may be capable of monitoring and protecting the motor using the methods described herein. Some examples of IEDs that may be used include protective relays, motor protective relays, and the like. The three phase current signals from the CTs 232A, 232B, and 232C may be provided to a processor 256 via various filters (such as low-pass filters, not separately illustrated), an analog-to-digital converter (A/D) 252, and a multiplexor 254. Various other pre-processing devices and steps may be incorporated as desired. These various other pre-processing devices and steps may be performed on a processor or the like. Further, the pre-processing devices and steps may include a sampler (the A/D may function as a sampler) for sampling the signals. The signals representing the currents and voltages from the three phases and temperature from the RTDs are ultimately provided to a processor (such as a microprocessor, microcontroller, application specific integrated circuit (ASIC), field programmable gate array (FPGA), and the like), where the methods described herein are performed. The IED may include data storage 258 (such as a non-transitory computer-readable storage medium) where the particular modules, calculators, and/or computer instructions for operating the present methods may be stored. Further, values calculated by the processor 256 may be stored using the data storage 258. The IED thus contains various calculators and/or modules for making the various calculations described herein, though the various calculators are not separately illustrated.

The data storage 258 may include computer instructions executable by the processor 256 for monitoring the motor. In particular, such computer instructions may be executable for monitoring synchronization of the rotor of the motor as described herein. Such computer instructions may further be executable to open switch 214 and close 216 when synchronization has reached a predetermined threshold. As mentioned above, the motor may be started in induction mode, with the field windings 106 of the rotor 104 disconnected from the DC source 120 and instead closed in series with discharge resistor 112. When the synchronization has reached a predetermined threshold, switch 214 may be opened and switch 216 closed such that discharge resistor 112 is removed from the field winding 106 circuit, and DC power source 120 is introduced into the field winding 106 circuit. Switches 214 and 216 may be operated synchronously such that switch 214 is opened synchronously with the closing of switch 216.

The IED 250 further includes a communication module 260 that is capable of receiving commands from the processor 256 and transmitting such to receiving devices such as circuit breaker 206 and switches 214 and 216. Processor 256 may receive signals from the multiplexor 254. The signals may be digitized analog signals corresponding with current supplied to the windings of the stator 102 by phases 230A, 230B, and 230C, and obtained using CTs 232A, 232B, and 232C. Processor 256 may execute computer instructions stored in data storage 258 to determine synchronization of the motor using the signals from the multiplexor. Processor 256 may monitor a state of the motor using the determined synchronization of the motor. During startup, the computer instructions may include a threshold of synchronization and instructions for an action for the processor to take once it has determined that the synchronization has reached the threshold. For example, if the motor is a synchronous motor and is being started in induction mode, once the synchronization reaches the predetermined threshold, the processor may act to open switch 214 and close switch 216. Processor may send signals to the switches using the communications module 260. Communications module 260 may be any module capable of sending and/or receiving electric signals from the processor 256 to other equipment and devices. Communications module 260 may include one or more various physical interfaces such as, for example, serial or parallel interfaces, contact inputs, contact outputs, or the like. Communications module 260 may include further hardware capable of transforming the signal from the processor 256 for use by downstream equipment or devices, and for transforming signals from devices or equipment for use by the processor 256.

As mentioned above, data storage 258 may include computer instructions executable on the processor 256 for monitoring the motor. The computer instructions may include a synchronization module 259, configured to monitor synchronization of the motor. In one embodiment, the computer instructions may be for monitoring startup of a synchronous motor in an induction mode. The synchronization module may include the computer instructions executable on the processor for estimating a synchronization of the motor using current data from the multiplexor 254 in accordance with the methods described herein. For example, the synchronization module may include computer instructions executable on the processor configured to calculate root-mean squared values from the plurality of current values from the multiplexor, sum the root-mean squared current values, divide the sum by three, subtract a DC component to produce representative current values, determine zero-crossings of the representative current values, and calculate an estimate of synchronization using the zero crossings. The instructions of the synchronization module may further be configured to reconfigure the motor from induction mode to synchronous mode when the synchronization reaches a predetermined threshold, as described in more detail herein.

Figure 3A:
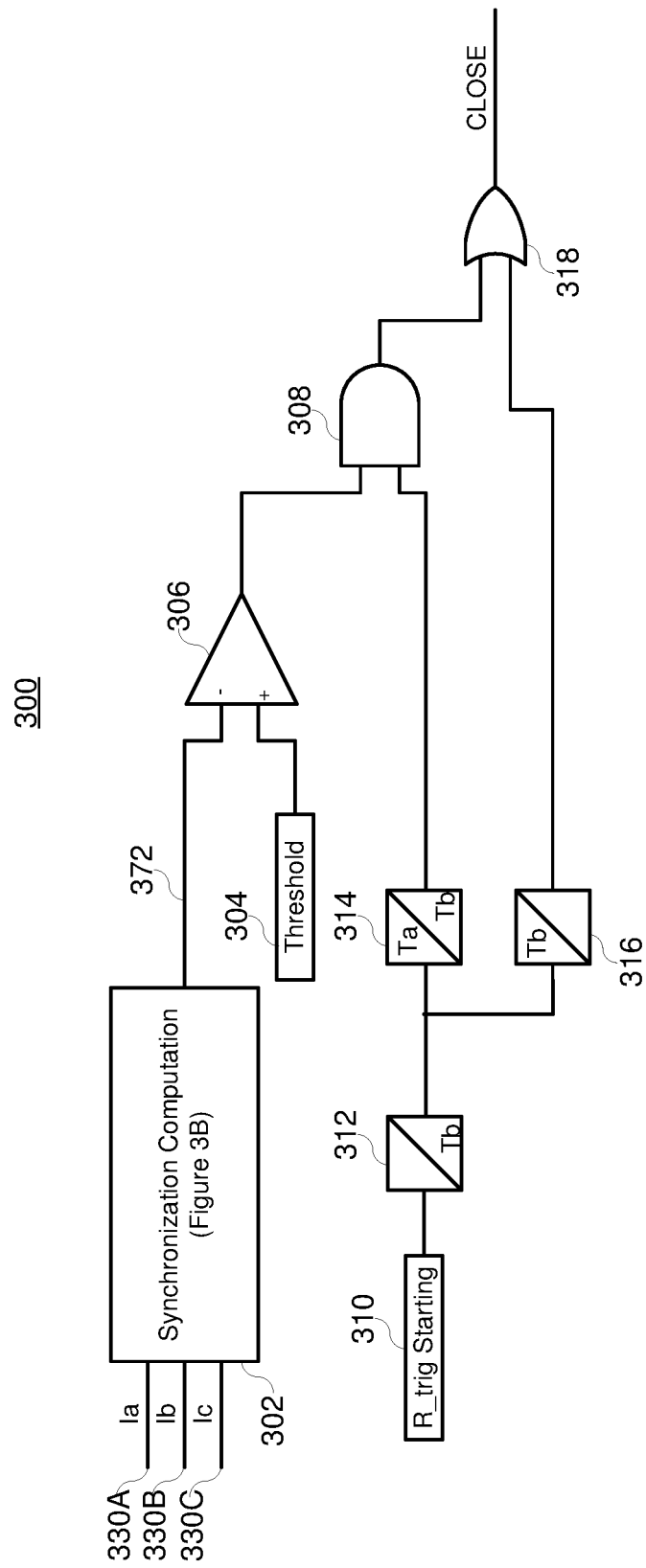
FIGS. 3A and 3B illustrate a logic diagram for monitoring synchronization of a motor.
Figure 3B:
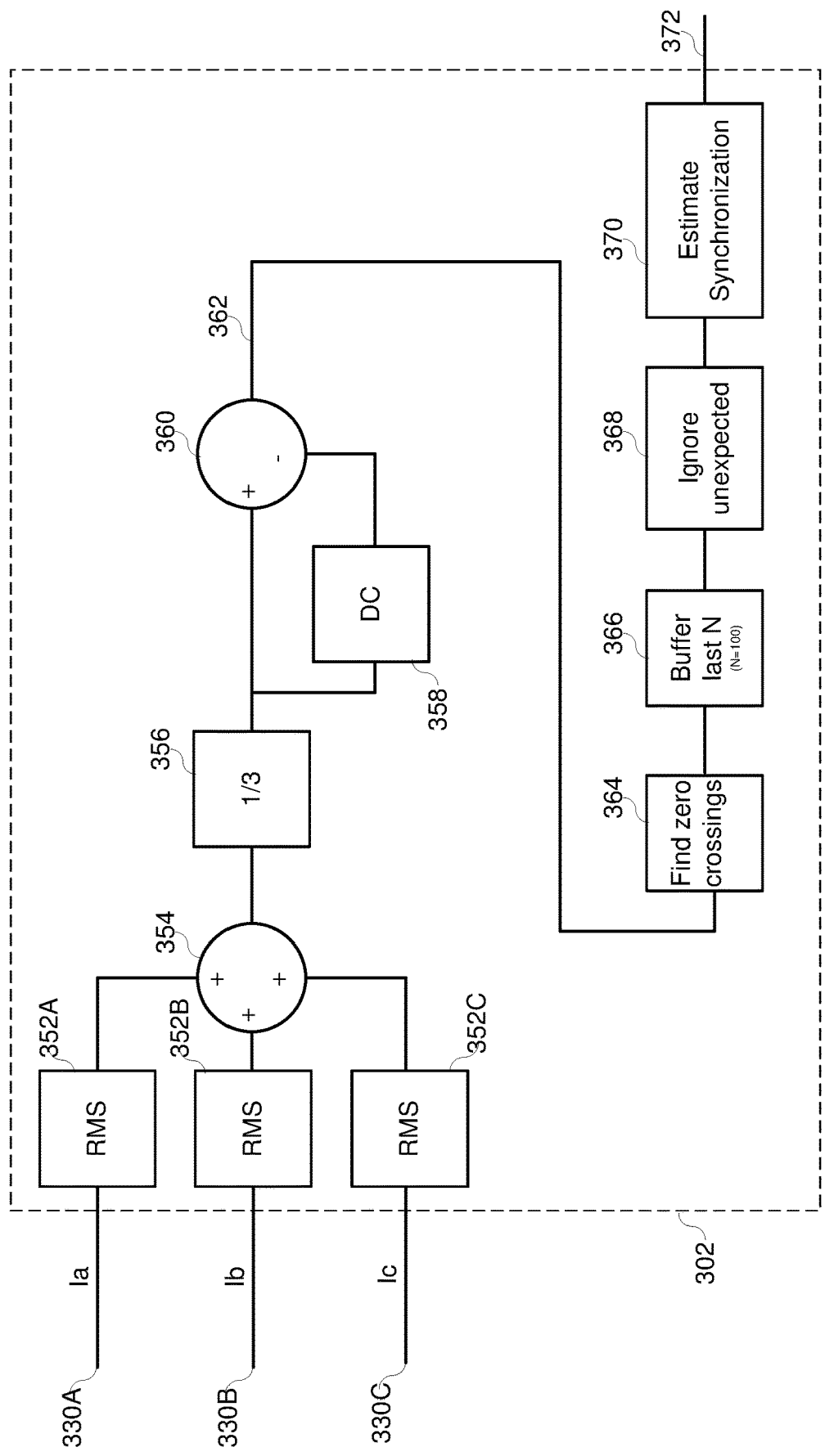

FIGS. 3A and 3B illustrate a simplified block diagram 300 of a logical set of computer instructions that may be stored in the data storage 258 and executed by the processor 256 for monitoring a motor. The computer instructions 300 may receive signals 330A, 330B, and 330C corresponding with currents in each of three phases to the motor. The signals 330A, 330B, and 330C may be digitized analog signals obtained using CTs as discussed above, and multiplexed before being communicated to the processor 256. The signals may be used to calculate a synchronization of the motor 302, discussed in more detail below in conjunction with FIG. 3B. The synchronization of the motor may be compared against a predetermined threshold 304 by comparator 306. As discussed above, the synchronization calculated by 302 may include slip, and the threshold may include a slip threshold. The slip threshold may be around 0.05. In another embodiment, the synchronization of the motor may be a ratio of the rotational frequency of the rotor to the nominal frequency of the motor. The threshold may be around 0.95. When the calculated synchronization reaches the predetermined threshold 304 (in terms of slip, when the slip falls below the threshold, and in terms of the ratio, when the ratio exceeds the threshold), then comparator 306 signals the AND gate 308, which, in turn, signals the OR gate 318.

Logic 300 also triggers 310 a timer 312 upon starting of the motor. The timer is configured such that Ta is a minimum sync time of the motor. The minimum sync time Ta may correspond with a minimum amount of time that must pass after startup for the motor to reach an acceptable level of synchronization before being reconfigured in synchronous mode. Further the timer is configured such that Tb is a maximum sync time of the motor. The maximum sync time Tb may be a maximum amount of time that can pass before the motor synchronization level has reached an acceptable level for reconfiguration from induction to synchronous mode. Time Ta must be less than time Tb. The logic 300 may be configured such that the processor cannot reconfigure the motor from induction to synchronous mode until time Ta has lapsed, and once time Tb has lapsed, the processor must reconfigure the motor from induction to synchronous mode. To that end, once the motor has started, timer 312 is initiated. Once time Ta has expired, but before time Tb has expired, 314 asserts high to AND gate 308. Thus, upon the synchronization reaching the predetermined threshold 304 and expiration of time Ta, AND gate 308 asserts to OR gate 318.

Upon expiration of time Tb, timer 316 asserts directly to OR gate 318. Thus, OR gate asserts upon either 1) expiration of time Ta (minimum time required for synchronization passes) and synchronization reaches the predetermined threshold 304; or, 2) expiration of time Tb (maximum time needed for synchronization). Assertion of OR gate 318 produces a signal for reconfiguration from induction mode to synchronous mode. That is, as illustrated in FIGS. 1 and 2, switch 114 is opened and switch 116 is closed.

FIG. 3B illustrates in more detail the calculation of synchronization 302 of FIG. 3A. Current signals 330A, 330B, and 330C are each used by the synchronization calculator 302, where root mean square ("RMS") values are determined for each phase in RMS calculators 352A, 352B, 352C. The RMS values from each phase are summed in adder 354. The sum is then reduced by ⅓ in 356. A DC component is calculated in 358 from the reduced sum of RMS values. The DC component is then subtracted from the reduced value in adder 360 to produce representative current values 362, which may be useful in calculating a rotational frequency of the rotor 362. The representative current values 362 may then be used to estimate a synchronization of the rotor.

The representative current values 362 are then processed to find a synchronization of the rotor. To that end, zero crossings of the values are found in 364 and N of the zero crossings are buffered in 366 along with the time associated with each particular value. Unexpected zero crossings are ignored in 368. Using the buffered zero crossings and ignoring unexpected zero crossings, synchronization is estimated 370, and the estimate 372 is output to comparator 306 (see FIG. 3A).

In one embodiment, synchronization may be the slip of the rotor. Returning to steps 364-370, slip may be estimated from the values 362. Slip may be calculated for each zero crossing using Equation 2:

$$\text{Slip\_temp}_k = 1 - \frac{FN - \frac{1}{2*2*\Delta t_k}}{FN} \qquad 2$$

where:
 Slip_temp$_k$ is a temporary calculation of slip at time k;
 FN is the fundamental frequency of the motor; and,
 $\Delta t_k$ is the time between zero crossing at time k and the previous zero crossing.

The last N values of Slip_temp may be buffered in 366. Unexpected values of slip may be ignored. Equations 3-6 include examples of unexpected values of slip that may be ignored according to various embodiments:

$$\text{Slip\_temp}_k > 1.1 \qquad 3$$

$$\text{Slip\_temp}_k < 0 \qquad 4$$

$$\text{Slip\_temp}_k < \frac{\text{Slip\_temp}_{k-1}}{TH\_TL} \qquad 5$$

$$\text{Slip\_temp}_k > TH\_TH * \text{Slip\_temp}_{k-1} \qquad 6$$

where:
 Slip_temp$_{k-1}$ is a temporary calculation of slip at time k−1;
 TH_TL is a threshold; and
 TH_TH is a threshold.

That is, the temporary value for slip at time k may be ignored when the value is greater than 1.1, or less than 0. The temporary value for slip at time k may also be ignored when the value at time k is less than 1/TH_TL of the temporary value of slip at time k−1. Finally, the temporary value for slip at time k may be ignored when the value is greater than a product of TH_TH and the temporary value of slip at time k−1. In one embodiment TH_TL may be selected as 4, and TH_TH may be selected as 2. Other conditions for determining which temporary values of slip may be used.

In various embodiments, past temporary values of slip may be used to calculate a final estimate of slip at time k. In one particular embodiment, a set of past temporary values of slip that are not ignored may be used in linear extrapolation to determine a final estimate of slip at time k. In other embodiments, polynomial extrapolation may use a set of past temporary values of slip that are not ignored to determine a final estimate of slip at time k.

The final estimate of slip at time k may be the estimated synchronization value 372 used by comparator 306. In this embodiment, the threshold 304 may be a slip threshold corresponding with a slip vale sufficiently close to synchronization for the motor to be reconfigured from induction startup mode to synchronous mode, as described in more detail herein.

Figure 4:
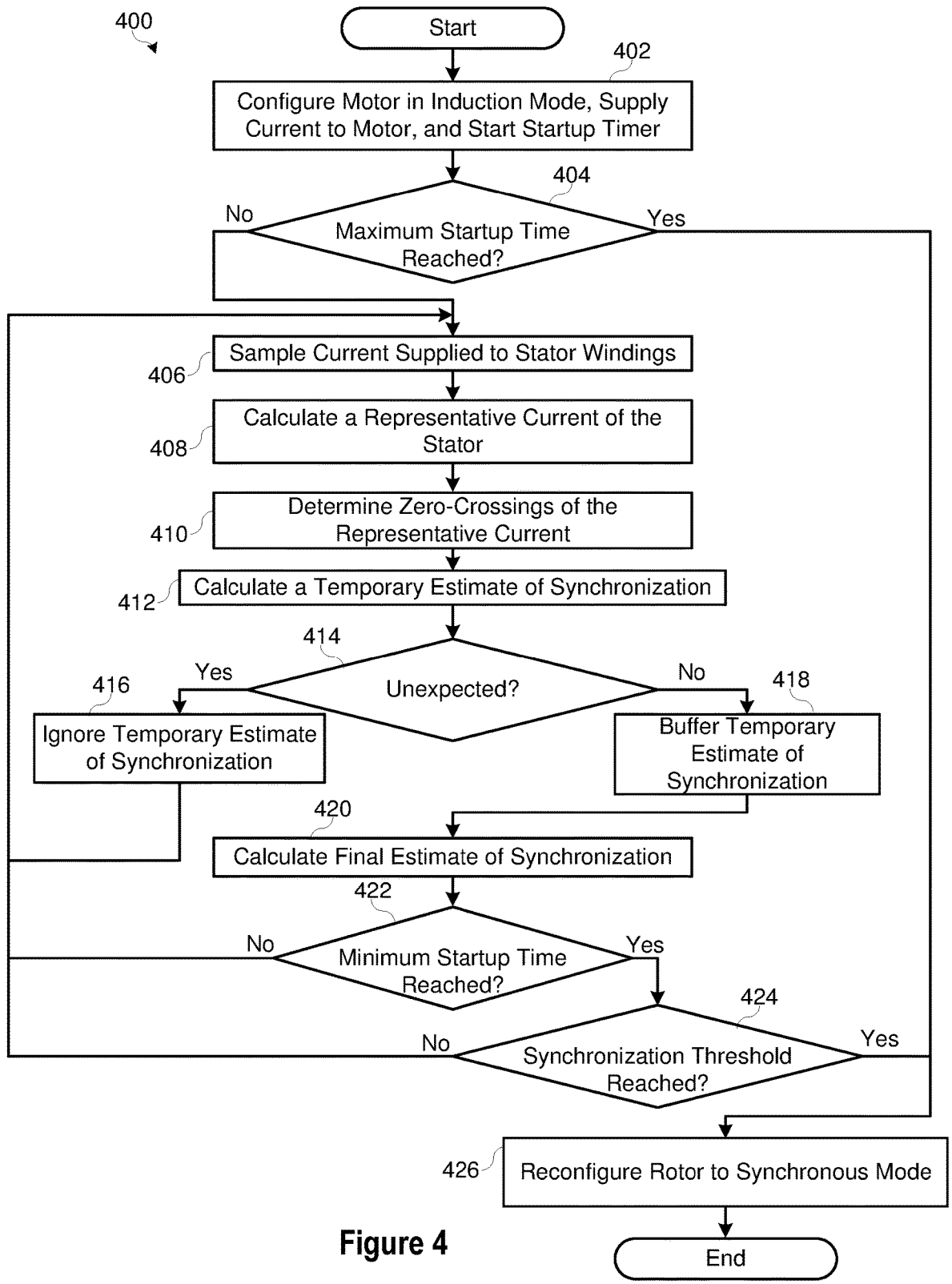
FIG. 4 illustrates a flow chart of a method for monitoring synchronization of a synchronous motor during startup in induction mode.

FIG. 4 illustrates a flow chart of a method 400 for using currents to monitor synchronization of a motor during startup. The method 400 starts with configuring the motor for startup in induction mode, supplying current to the motor, and starting a startup timer 402. That is, if the motor is a synchronous motor, the rotor may be configured to start in induction mode by closing the field winding with a discharge resistor, and disconnecting DC power from the field winding. Once the motor is configured in induction startup mode, electric power may be supplied to the stator windings, and the startup timer may be started.

The method may determine whether a maximum startup time has been reached 404. If the maximum startup time has been reached, then the method continues to reconfigure the rotor to synchronous mode 426, and ends.

Alternatively, if the maximum startup time has not been reached 404, then the method continues to sample current supplied to the stator windings 406. Representative current values may be calculated using the current samples 408. This calculation may include, as described above, calculating RMS values for each current phase, summing the RMS values, and subtracting therefrom a DC component calculated therefrom, to produce representative current values. In some embodiments, the summed RMS values may be divided by a factor such as three. The representative current values may be used to determine a rotational frequency of the rotor, and/or synchronization of the motor. Thus, a synchronization of the motor may be determined using only stator current values. That is, synchronization of the motor may be determined without using readings from the rotor such as a voltage across a discharge resistor of the field windings in induction mode. Accordingly, additional hardware such as the voltage measurement device does not need to be installed or monitored to determine a synchronization of the motor.

From this quantity, zero crossings of the quantity may be determined 410. With each zero crossing, a present temporary estimate of synchronization may be calculated 412. If the present temporary estimate is unexpected 414, then the present temporary estimate is ignored 416, and the method returns to step 406. If, however, the present temporary estimate is not unexpected 414, then the present temporary estimate is stored in a buffer of temporary estimates of synchronization 418.

The process continues from the determination of whether the value was unexpected 414 to monitor startup of the motor. According to the illustrated embodiment, the method proceeds to calculate a final estimate of synchronization 420. As described above, calculating the final estimate of synchronization 420 for time k may include an extrapolation using a set of previously calculated temporary estimates of synchronization from the buffer using linear, polynomial, or other extrapolation techniques.

The method may continue to determine whether the minimum startup time has been reached 422. If the minimum startup time has not been reached, then the method returns to continue sampling in step 404. However, if the minimum startup time has been reached 422, then the method determines whether the synchronization threshold has been reached 424. If the synchronization threshold has not been reached, then the method continues to obtain samples in step 406. However, if the synchronization threshold has been reached 424 and the minimum startup time has been reached 422 then the method reconfigures the rotor to synchronous mode 426, and ends.

IEDs may be used to monitor various conditions during startup, running, and shutdown of an electric motor. For example, an IED may be used to monitor a thermal condition of an electric motor during startup and during a running condition. That is, an IED may be used to monitor or calculate a temperature of a stator of an electric motor, and protect the motor by signaling a breaker to open if the predetermined threshold is exceeded. In various systems, a temperature of a rotor or a stator cannot be directly measured, but must instead be calculated using available measurements from the electric motor. Likewise, in certain systems, rotor slip measurements are not available, or may not be available during a certain stage such as during startup of the electric motor. Furthermore, certain measurements, such as a field winding current, may not be available during startup as is discussed in more detail hereinabove. Accordingly, described herein are systems and methods for electric motor thermal protection using slip calculated from stator measurements (or, that is, calculated without measurements from a rotor). More particularly, described herein are systems and methods for calculating slip using measurements from a stator and applying electric motor thermal protection using the calculated slip.

Figure 5A:
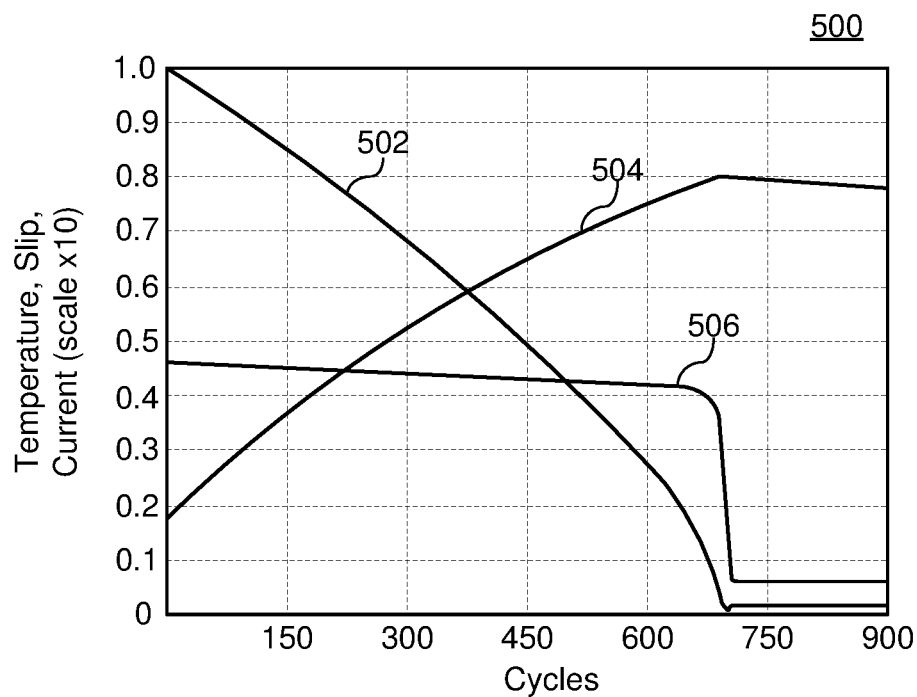
FIG. 5A is a diagram showing rotor temperature, current, and slip during motor startup.

FIG. 5A illustrates a diagram 500 showing traces during a typical startup of an electric motor. As can be seen, the current into the motor 506 remains at a relatively high level until the rotor reaches its rated speed, seen at between about 650 and 700 power system cycles. The current then drops to a relatively constant value. The rotor temperature 504 is plotted on a per-unit basis. As can be seen, the temperature 504 increases quickly during startup until the rotor approaches and reaches its rated speed between about 650 and 700 power system cycles. The temperature 504 reaches a maximum value of around 80% of its maximum allowable temperature. Once the rated speed is reached, the current decreases, and the rotor temperature slowly decreases as well. The slip 502 is also plotted on a per-unit basis. As can be seen, slip starts at a value of 1 at startup, and decreases until the rotor reaches its rated speed at between about 650 and 700 power system cycles.

Figure 5B:
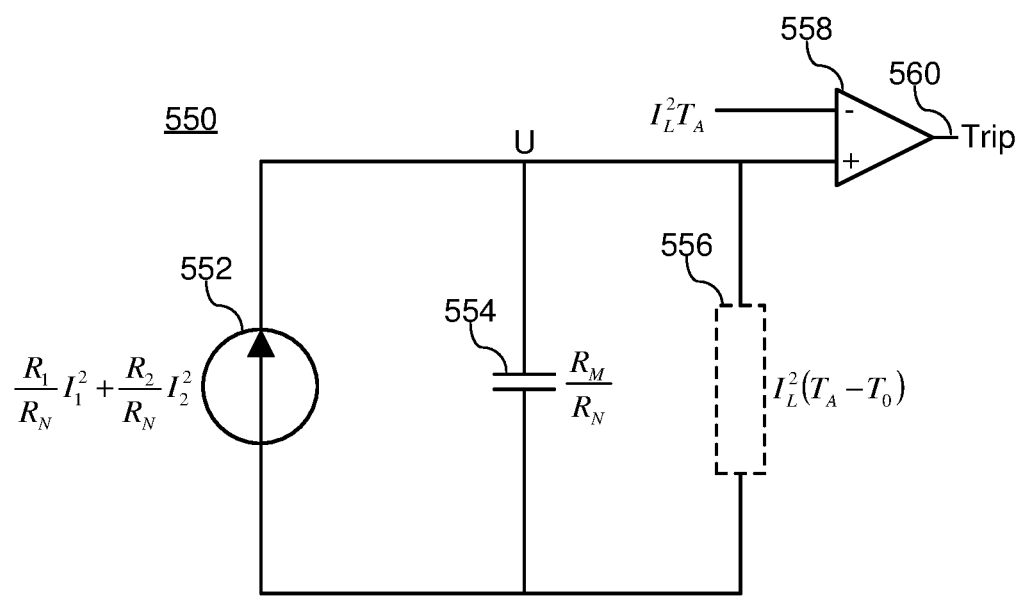
FIG. 5B illustrates a circuit diagram of a rotor thermal model for an electric motor.

FIG. 5B illustrates a first-order thermal model 550 of the rotor temperature of the motor. The model 550 illustrates the heating effect caused by the power supplied to the motor 552. The heating effect is a sum of the positive-sequence current ($I_1$) and the negative-sequence current ($I_2$) multiplied by their respective resistances, thus:

$$\frac{R_1}{R_N}I_1^2 + \frac{R_2}{R_N}I_2^2 \qquad 7$$

where:
$R_N$ is the rotor resistance at rated speed;
$R_2$ is the negative-sequence rotor resistance; and
$R_1$ is the positive-sequence rotor resistance.

The rotor resistance at rated speed $R_N$ can be calculated using:

$$R_N = 1 - \frac{FL\omega}{Syn\omega} \qquad 8$$

where:
FLω is the full-load speed; and,
Synω is the synchronous speed.

The positive-sequence rotor resistance R1 and the negative-sequence rotor resistance R2 can be calculated using Equations 9 and 10, respectively:

$$R_1 = (R_M - R_N)S + R_N \qquad 9$$

$$R_2 = (R_M - R_N)(2-S) + R_N \qquad 10$$

where:
$R_M$ is the locked rotor resistance; and,
S is motor slip.

The locked rotor resistance RM can be calculated using:

$$R_M = \frac{LRQ}{I_L^2} \qquad 11$$

where:
LRQ is the locked rotor torque in per-unit of rated torque; and,
$I_L$ is the locked rotor current in per-unit full load current.

Turning again to FIG. 5A, the capacitive element 554 represents the thermal mass of the rotor and is calculated using $R_M/R_N$, with RM and RN being described above.

The resistive element 556 represents the cooling effect present in the motor and can be calculated using:

$$I_L^2(T_A - T_0) \qquad 12$$

where:
$T_A$ is the locked rotor thermal limit time, starting with the motor at ambient temperature; and, $T_0$ is the locked rotor thermal limit time starting when the motor is at a run temperature.

During startup, the model can be assumed to be adiabatic, modeled by eliminating the resistive element 556. Thus results in the temperature U being calculated by the combination of elements 552 and 554.

The combined effect of elements 552, 554, and 556 is compared in comparator 558 against the threshold of $I_L^2 T_A$. If it is greater than the threshold, then the model produces an output 560 resulting in a trip signal, ultimately causing the motor to trip off.

As can be seen above, determining whether to trip a motor during startup depends on a comparison of the calculated thermal effect U of the motor against a threshold value. The thermal effect U on the motor is a function of motor resistance, which, in turn, is a function of slip.

Rotor resistance Rr is calculated using:

$$R_r = (R_M - R_N) S + R_N \qquad 13$$

where it is plainly seen that rotor resistance $R_r$ is a function of slip S, locked rotor resistance, ($R_M$, a constant), and rotor resistance at rated speed, ($R_N$, also a constant). Because the thermal effect on the rotor is a function of the rotor resistance, a more accurate calculation of slip yields a more accurate calculation of rotor resistance, in turn leading to accurate temperature calculations and better motor protection and monitoring.

Accordingly, the heating effect calculated using Equation 7 is a function of rotor resistance at a rated speed ($R_N$), negative-sequence rotor resistance ($R_2$), and positive-sequence rotor resistance ($R_1$), where the positive and negative sequence rotor resistances are functions of slip (Equations 9 and 10). Other thermal models may be used wherein the heating effect is a function of slip.

In certain embodiments, as described herein, rotor resistances, currents, and/or voltages are not available to be measured. Accordingly, a value of slip may be determined using the methods and systems as described herein using stator measurements. In one particular embodiment, slip values as determined using Equations 2-6 may be used to determine slip of the rotor, which may be used in a thermal model to apply thermal monitoring and protection to a motor according to Equations 7-13 or any other thermal model that uses slip. According to several embodiments herein, slip (S) may be calculated using stator currents.

Figure 6:
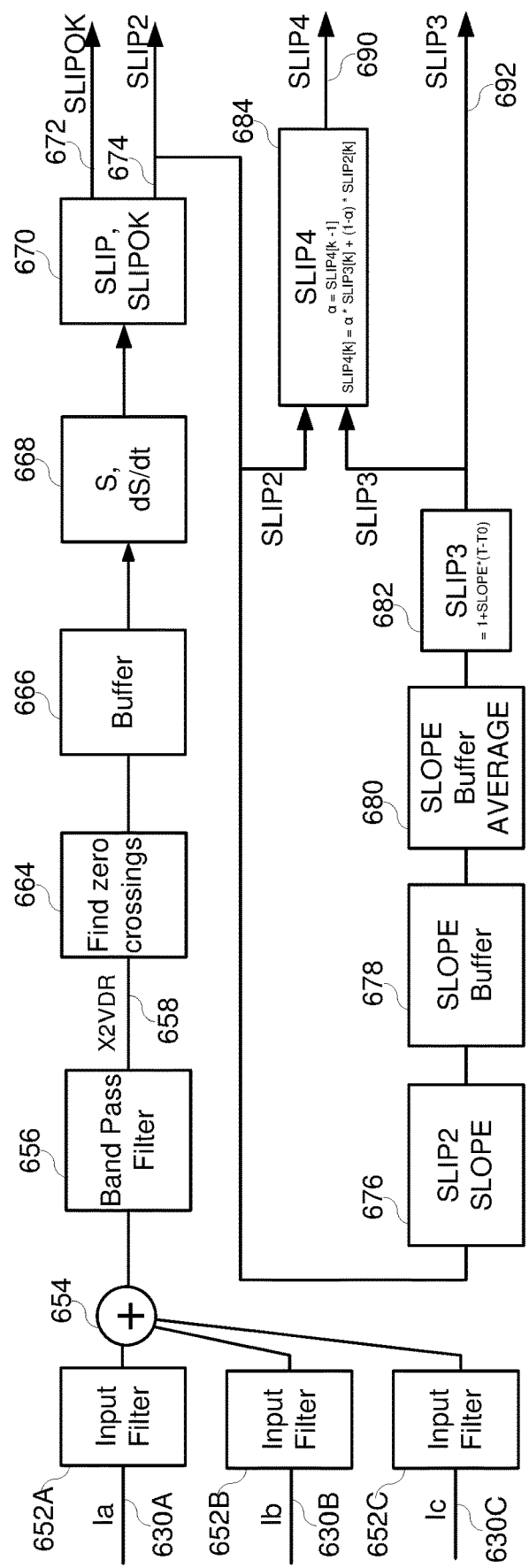
FIG. 6 illustrates a logic diagram for calculating slip using only stator values.

FIG. 6 illustrates a logic diagram useful for calculating slip using stator currents. Such slip may then be used according to several embodiments herein to determine motor synchronization, apply thermal monitoring and protection, and the like. Stator currents $I_A$ 630A, $I_B$ 630B, and $I_C$ 630C are each filtered according by input filters 652A, 652B, and 652C. The input filters may filter based on a number of samples such as, for example, 32 samples. In one embodiment, the input filters calculate RMS values based on 32 samples. In another embodiment, the input filters calculate a sum of the squares of a number of samples such as, for example, 32 samples. Other input filters may be used. The filtered signals are then summed in adder 654. The summed RMS values are then filtered using, for example, a band pass filter 656 to produce filtered signal X2VDR 658. The filtered signal 658 may be a composite signal of the three input currents 630A, 630B, and 630C.

Times of zero crossings of the filtered signal X2VDR 658 are then determined in 664. The times of zero crossings $t_k$ are buffered in buffer 666, which may buffer a predetermined number of zero crossing times such as, for example, the time of 7 times of zero crossings may be maintained in the buffer 666. The time between consecutive zero crossings may then be used to determine slip values in slip block 668 according to Equation 14-15:

$$S_k = Y_{k-1} + \frac{Y_k - Y_{k-1}}{2} \qquad 14$$

$$Y_k = \frac{1}{4 * DeltaT_k * FREQ} \qquad 15$$

where:
$S_k$ is the motor slip for sample k;
$DeltaT_k$ is the time between zero crossings at k and at k−1; and,
FREQ is the frequency of the electrical signal applied to the motor.

A derivative of the slip $dS_k/dt$ is also calculated in 668, according to Equation 16:

$$\frac{dS_k}{dT} = \frac{S_k - S_{k-1}}{DeltaT_k} \qquad 16$$

The slip $S_k$ and rate of change of slip $dS_k/dt$ are then used to determine slip in 670. In some embodiments, slip $S_k$ may be used in a thermal module to monitor and provide thermal protection to a motor.

In some embodiments, however, $S_k$ may not be useful for providing thermal monitoring and protection. For example, during startup, values of $S_k$ may be unreliable. Accordingly, intermediate slip values, or slip estimates, may be calculated and used to calculate a slip value useful for thermal monitoring and protection of the electric motor. Slip $S_k$ as calculated above may be used as an intermediate or estimated slip value. Block 670 may determine a SLIP2 value by, for example, buffering a predetermined number of $S_k$ values. If all of the 5 most recent values of $S_k$ are between 0 and 1, then Block 670 may use the most recent value of $S_k$ as the SLIP2 value. SLIP2 may then be used to provide thermal monitoring and protection to the electric motor. Furthermore, block 670 may determine if the 5 most recent values of dS/Dt are within 1 and −2. If so, then the SLIPOK bit may be set to 1, and the SLIP2 value may be used to provide thermal monitoring and protection to the electric motor. Otherwise, the SLIPOK bit may not be set, and the SLIP2 values may not be used.

In various embodiments, further refinements to slip may be calculated to, for example, increase security of thermal monitoring and protection of an electric motor. In one embodiment, values of SLIP2 are used to calculate SLIP3. A slope of SLIP2 may be calculated in block 676 according to, for example, Equation 17:

$$Slip2Slope = \frac{(1 - SLIP2_k)}{T_k - T_0} \qquad 17$$

Block 678 may then buffer a predetermined number of Slip2Slope values. Buffer 678 may be prefilled with zeroes. Block 680 may compute an average of the values in the buffer 678. Block 682 may then calculate SLIP3 according to, for example, Equation 18

$$Slip3 = 1 + SLOPE*(T - T_0) \qquad 18$$

where SLOPE is the slope computed in 680.

SLIP4 may then be calculated in 684 using Equations 19 and 20:

$$SLIP4_k = \alpha * SLIP3_k + (1-\alpha) * SLIP2_k \quad\quad 19$$

$$\alpha = SLIP4_{k-1} \quad\quad 20$$

Accordingly, values of SLIP4 will initialize at 1 and decrease as SLIP2 decreases. That is, values of SLIP4 are biased to unity during the initial startup of the electric motor. In several embodiments herein, SLIP4 is used to provide thermal monitoring and protection to an electric motor. This results in a more secure monitoring, because as the value of slip near 1 will result in calculating more heating in a motor than what may be actually occurring during the initial starting of the motor. As the rotor begins to spin, the actual slip decreases, and the values of SLIP4 also decrease.

As described above, various slip estimates may be calculated to determine a slip value (such as SLIP4) that may be used in thermal monitoring and protection of the electric motor. In various embodiments, any of $S_k$, SLIP2, SLIP3, and SLIP4 may be used for providing thermal monitoring and protection of an electric motor.

Figure 7:
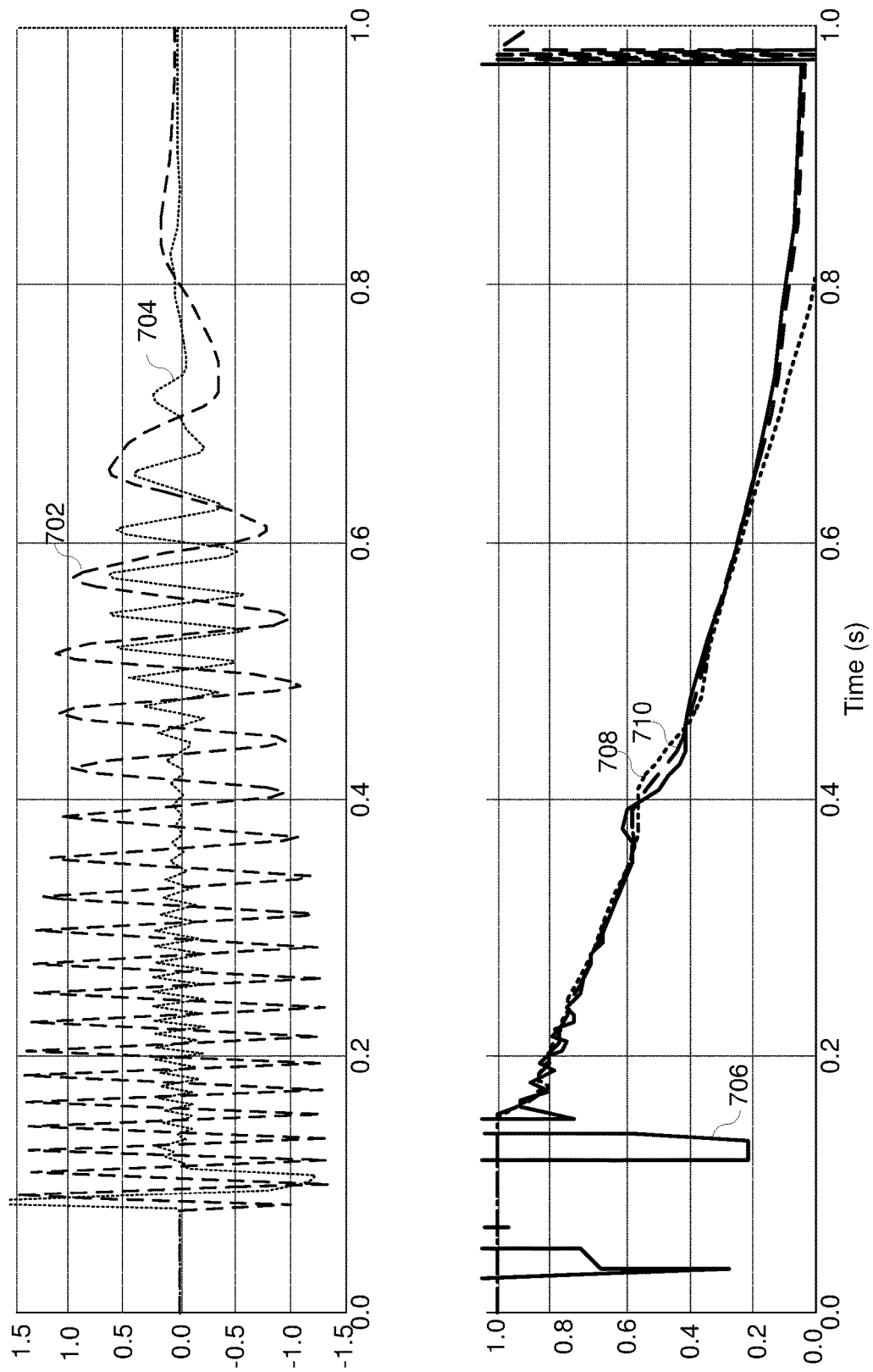
FIG. 7 illustrates plots of a motor start and outputs of calculations used herein.

FIG. 7 illustrates plot diagrams of measured and calculated values during a motor startup. Values of a measured signal are illustrated along with values of X2VDR 704 from, for example, a band pass filter 656 of FIG. 6. Furthermore, values of Slip2 706, Slip3 708, and Slip4 710 are illustrated. As can be seen, the values of Slip2 are somewhat erratic during the initial starting period. Values of Slip4 710 may be used for secure monitoring and protecting of an electric motor.

Figure 8:
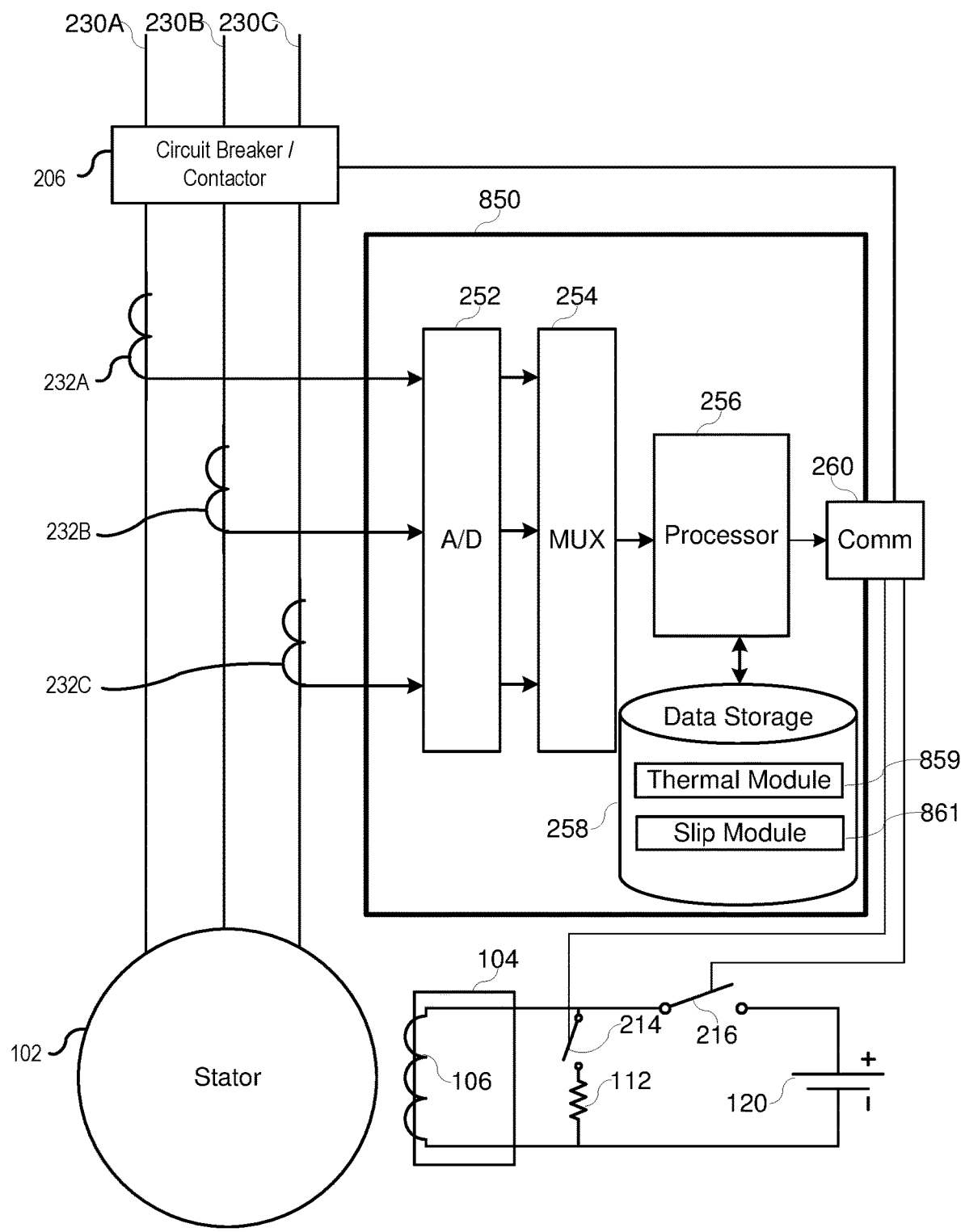
FIG. 8 illustrates a block diagram of a system for providing thermal protection to an electric motor.

FIG. 8 illustrates a functional block diagram of a system for providing thermal monitoring and protection to an electric motor using only measurements from a stator of the electric motor. The system uses an IED 850 similar to the IED 250 of FIG. 2. IED 850 includes, among other things, a data storage 258 that includes a slip module 861 and a thermal module 859. The slip module may include instructions that, when operated on a processor, may cause the processor to calculate slip using only measurements from the stator of the electric motor, according to various embodiments herein. Furthermore, the data storage 258 may include a thermal module 859 that includes instructions that, when operated on a processor, may cause the processor to provide thermal monitoring and protection to an electric motor using slip from the slip module 861 according to various embodiments herein. The thermal module 859 may determine that a thermal condition of the electric motor exceeds a predetermined threshold. The thermal module 859 may then signal the circuit breaker 206 to open, thus disconnecting the electric motor from a power source to protect the motor.

As described above, slip may be calculated under certain conditions for salient pole motors. Various embodiments herein provide estimates of slip during a startup of the electric motor. In addition to the embodiments described hereinabove, systems and methods to monitor synchronization of a motor are described herein. Voltages and currents may be used to calculate motor slip both during startup and during operation of the motor. Embodiments described below may calculate slip during locked rotor conditions.

Figure 9:
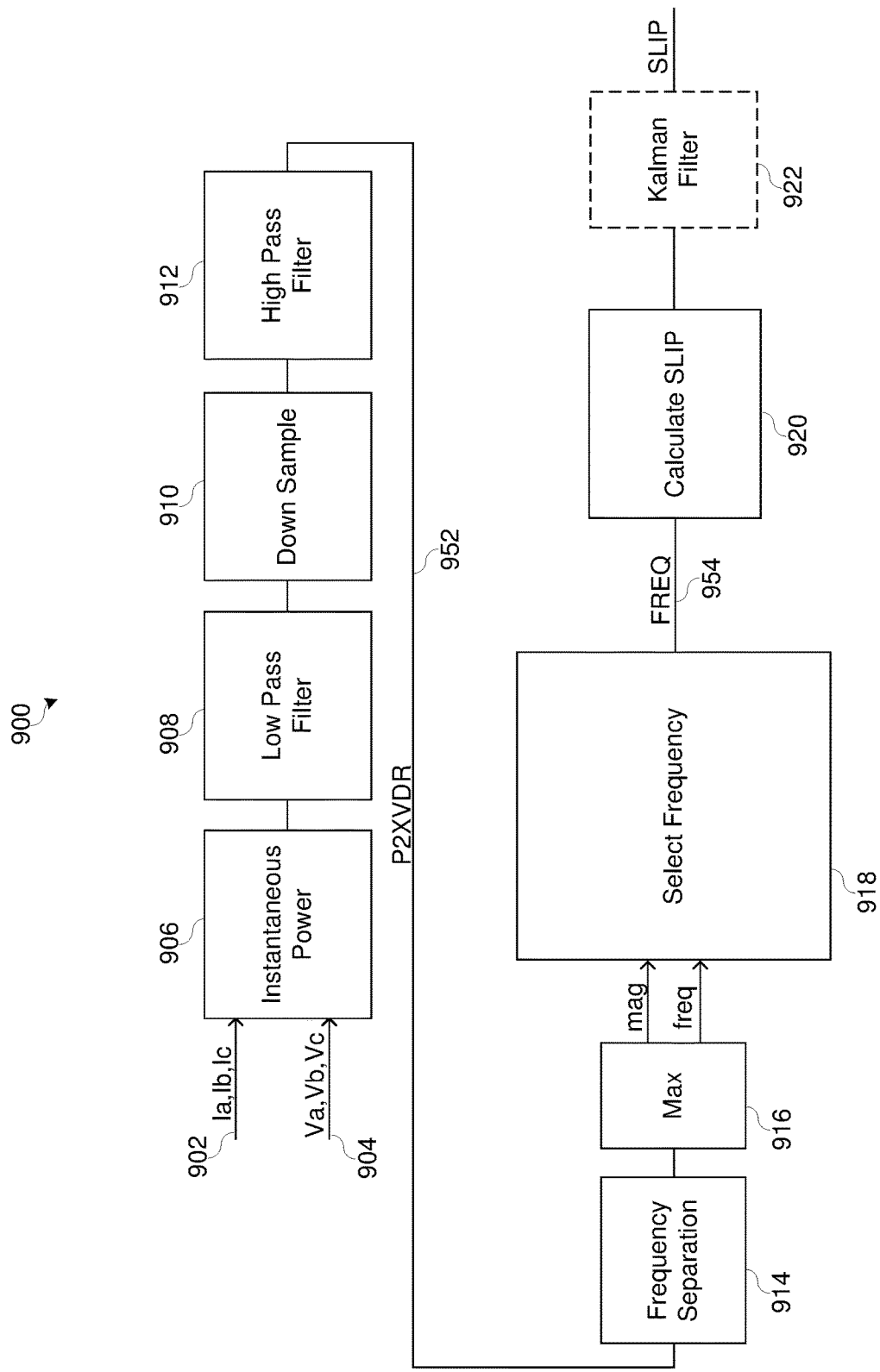
FIG. 9 illustrates a logic diagram for calculating slip from stator voltage and current values.

FIG. 9 illustrates a simplified logic diagram used to calculate slip of a motor. Current signals 902 and voltage signals 904 provided to the stator of the motor The current and voltage signals 902, 904 may be digitized analog signals such as signals from an analog-to-digital converter. In certain embodiments, the current and voltage signals 902, 904 may be digital signals originally sampled remotely. The current and voltage signals 902, 904 may be provided at a predetermined sampling rate such as, for example, 32 samples per power system cycle.

An instantaneous composite power may be calculated 906 from the current and voltage signals 902, 904. Although power may be calculated using various methods, the instantaneous power may be calculated using, for example, using Equation 21:

$$Power = Ia*Va + Ib*Vb + Ic*Vc \quad\quad 21$$

where:
Ia is an A-phase current sample;
Ib is a B-phase current sample;
Ic is a C-phase current sample;
Va is an A-phase voltage sample;
Vb is a B-phase voltage sample; and,
Vc is a C-phase voltage sample.

The calculated power may be filtered using a low-pass filter 908 to remove high-frequency components in the power signal. The low-pass filter may be a first order IIR filter. The filter may include two filters, which may be identical filters. The filter may be a first order IIR filter with a cutoff of around 160 Hz.

In certain embodiments, the power signal may be down sampled 910. In some embodiments the signal is not down-sampled. However, down sampling may be advantageous to reduce processor burden. For example, the 32 sample-per-cycle power signal may be down sampled to, for example, 4 samples per cycle.

The down-sampled signal (if the signal is down-sampled, otherwise the signal from the low-pass filter 908), may then be filtered using a high-pass filter 912 to remove, low frequency components such as, for example, direct current ("DC") components. In one embodiment, the high-pass filter may be a first order IIR with a cutoff of around 3 Hz. In certain embodiments, multiple high-pass filters may be used. In one embodiment two high-pass filters may be used. The high-pass filters may be identical. The signal 952 from the high-pass filter 912 may represent an instantaneous power frequency signal at twice the slip frequency of the motor, denoted as P2XVDR.

The instantaneous power frequency signal 952 may be filtered to separate the instantaneous power frequency signal 952 into separate magnitudes for predetermined frequencies using frequency separation 914. In one embodiment, Goertzel's filters may be used for this separation, as described in more detail in conjunction with FIG. 10. In another embodiment, discrete Fourier transform may be used to separate frequencies. The frequency with the greatest magnitude may be determined from among the separated magnitudes for predetermined frequencies 916.

The determined frequency and its magnitude are then used to select the signal frequency used to calculate slip 918. In certain embodiments, the frequency signal corresponding to the maximum magnitude from 916 may be selected as the signal frequency in 918 to be used to calculate slip, and reported as the frequency signal 954. In other embodiments, frequency signal may be selected in 918 depending on previous reported frequencies. In such embodiments, a buffer of past frequencies may be maintained. The buffer of past frequencies may be populated with a predetermined frequency upon startup. The predetermined frequency upon startup may be determined based on an expected frequency signal corresponding with a locked rotor condition (or a slip of 1). In one example, the expected frequency signal corresponding with a locked rotor condition is twice the nominal operating frequency of the power system. In one example, a motor may be powered by an electric power system operating nominally at 60 Hz. Due to the way in which salient poles in synchronous motors modulate the stator currents, the instantaneous power of the electric motor includes a frequency component that is two times the rotational slip of the motor. In a system operating at 60 Hz, the motor will have a slip of 1 (locked rotor) when the observed instantaneous power has a frequency of 120 Hz. Accordingly, the buffer may be filled with the frequency of 120 Hz representing a stopped or locked rotor, which is the state of a motor before startup.

In various embodiments, the buffer may be a two-sample buffer. In some embodiments, the frequency determined in 918 may be calculated according to the following:

when $k=0 \rightarrow Freq_{k-1}=120$ Hz;
   if magnitude<0.075→Freq=$Freq_{k-1}$;
   if $Freq_{k-1}-Freq_k$>50→Freq=$Freq_{k-1}$;
   if $Freq_{k-1}-Freq_k$>25→Freq=$Freq_{k-1}$+0.1;
   if $Freq_{k-1}-Freq_k$<-50→Freq=$Freq_{k-1}$;
   if $Freq_{k-1}-Freq_k$<-25→Freq=$Freq_{k-1}$+0.1;
   else→Freq=$Freq_k$
where:
  k denotes a time or sample index;
  magnitude refers to the magnitude reported by block 916;
  $Freq_k$ refers to the frequency at time or sample index k;
  $Freq_{k-1}$ refers to the frequency at time or sample index k-1; and,
  Freq refers to the frequency 954 reported by block 918.

It should be noted that more, different, or fewer constraints may be made in reporting frequency 954. The frequency signal 954 may be used to compute a slip 920 of the motor. As mentioned above, the frequency signal 954 during a stopped or locked rotor condition may be twice the nominal power system frequency. Where slip is determined as a ratio of the rotational speed of the motor over the nominal rotational speed of the motor, slip may be calculated according to Equation 22:

$$Slip = \frac{Freq}{2*F_{nom}} \qquad 22$$

where $F_{nom}$ denotes the nominal rotational frequency of the electric motor. When the rotor is stopped, the frequency signal 954 would be reported as 120 Hz, which, when divided by 120 (2*60 Hz) yields 1, indicating a locked rotor condition. As the rotor begins to turn, the frequency signal 954 decreases, resulting in a decrease in slip.

In certain embodiments, it may be desired to smooth out the calculated slip value. A Kalman filter 922 may be used to smooth out the calculated slip value for use by various monitoring and protection algorithms.

Figure 10:
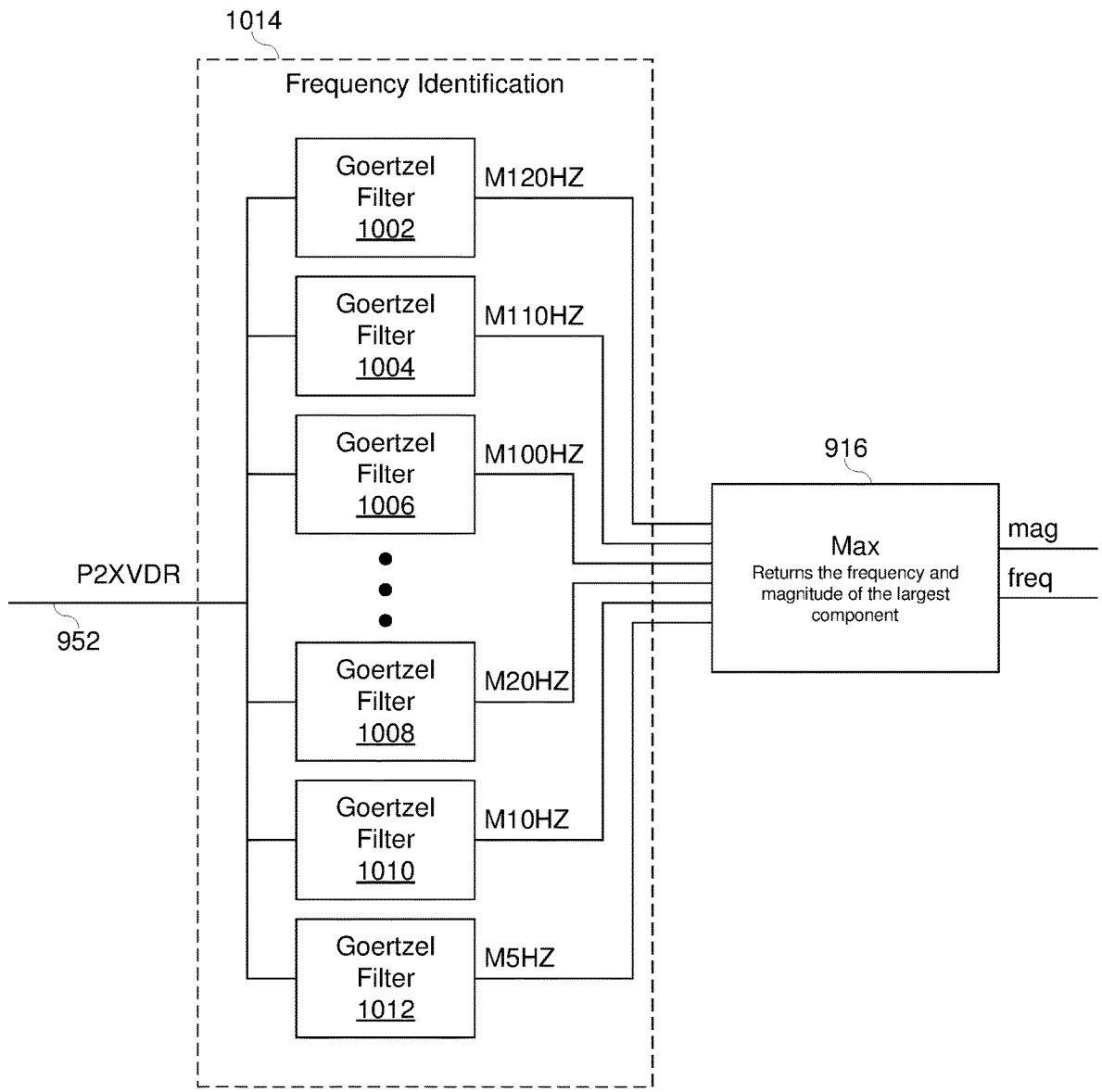
FIG. 10 illustrates a simplified logic diagram for calculating frequency and magnitude components at predetermined intervals.

As is discussed above, the instantaneous power signal 952 may be separated out into various frequencies 914. FIG. 10 illustrates a simplified block diagram of a frequency identification 1014 useful for separating out the instantaneous power signal into predetermined frequencies, and determining a magnitude for each predetermined frequency. The frequency identification 1014 may be in the form of Goertzel filters tuned to the predetermined frequencies. Frequency identification 1014 may include a number of Goertzel filters 1002, 1004, 1006, 1008, 1010, 1012, each tuned to a different predetermined frequency. As illustrated, various predetermined frequencies include 120 Hz, 110 Hz, 100 Hz, 20 Hz, 10 Hz, and 5 Hz. More, different, or fewer filters and frequencies may be used. The magnitude and the frequency signal outputs are provided to the MAX block 916, which returns the frequency and magnitude of the frequency with the largest magnitude component.

The calculated slip value may be used in various motor monitoring and protection algorithms. For example, the calculated slip value may be used for monitoring for locked rotor conditions during startup. The slip value may be used for thermal monitoring of the electric motor using, for example, various thermal monitoring and protection as described herein. The slip value may be used to monitor and protect for overspeed of the rotor during operation. The slip value may be used to determine loss of load during operation of the motor. The slip value may be used to monitor and protect for overacceleration of the rotor during startup and/or operation of the motor.

Figure 11:
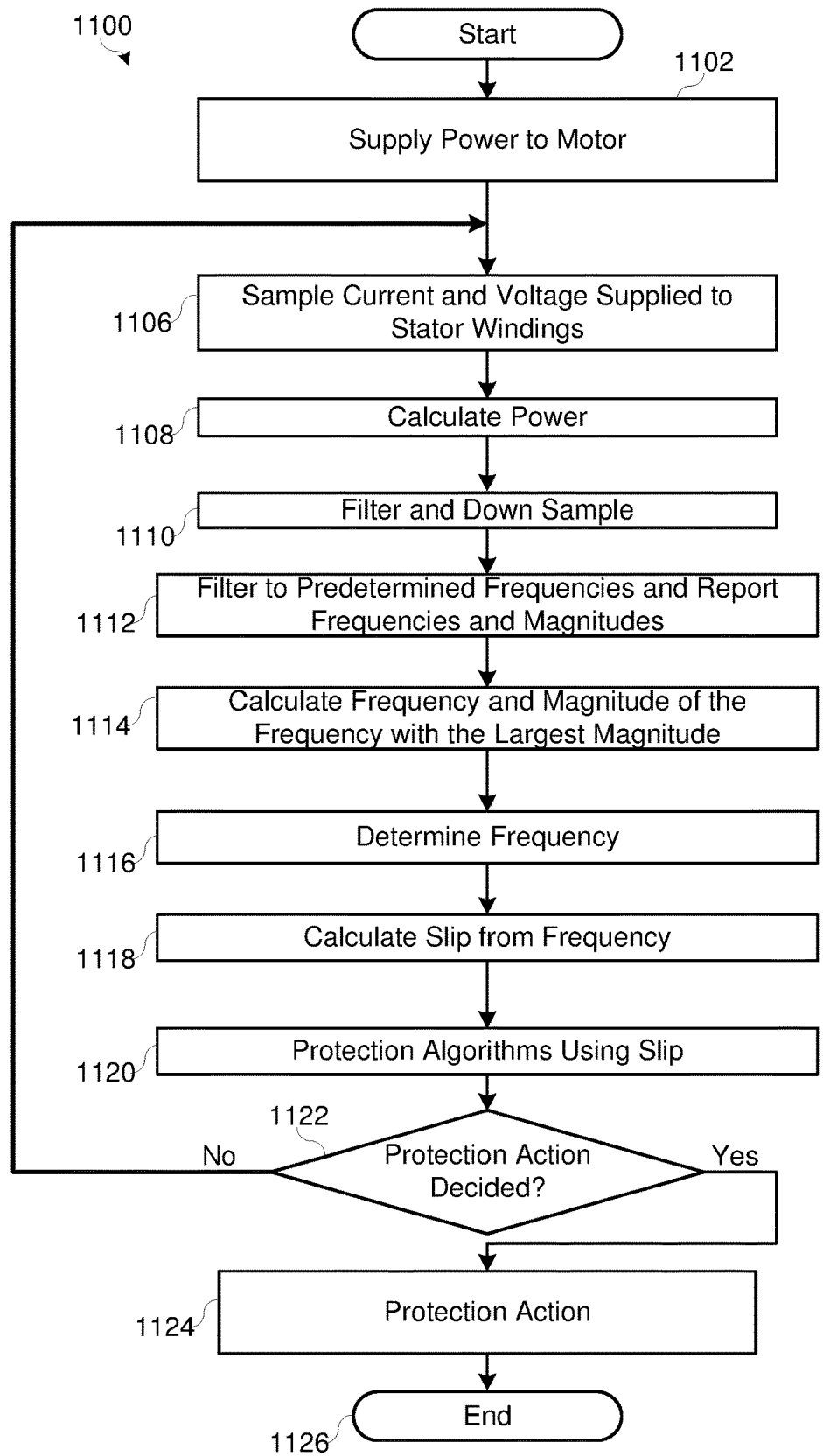
FIG. 11 illustrates a flow chart for calculating slip from stator voltages and currents.

FIG. 11 illustrates a simplified flow chart of a method 1100 for calculating slip from stator voltages and currents, and applying motor monitoring and protection. The method starts with supplying power to the electric motor 1102. Current and voltage of the power supplied to the stator of the electric motor may be sampled 1106. The current and voltage samples may be used as described in more detail herein to calculate instantaneous power 1108. The instantaneous power may be filtered and optionally down sampled 1110. The filtered instantaneous power may be filtered again to separate into predetermined frequencies and the magnitude of each predetermined frequency 1112. This separation may be performed using Goertzel's filters. Other filters and methods such as, for example, discreet Fourier transform may be used to separate the filtered instantaneous power signal into predetermined frequencies. The magnitudes and frequencies may be used to calculate the frequency and magnitude of the frequency with the largest magnitude component 1114. The reported frequency and magnitude are used to determine the frequency 1116. In certain embodiments, the reported frequency is simply the frequency determined in 1114. In other embodiments, slewing and filtering may be performed as discussed herein to smooth the signal and/or to remove erroneous frequency calculations.

The determined frequency may be used to calculate slip 1118. As described herein, the calculated slip may be used by various protection algorithms 1120. If the protection algorithm determines that a protection action is needed 1122, the method may perform the protection action 1124 which may include, for example, signaling a circuit breaker to open to remove electric power from the motor, and the method may end 1126. If no protection action is needed in 1122, then the method may return to sampling current and voltage supplied to the stator windings 1106.

Figure 12:
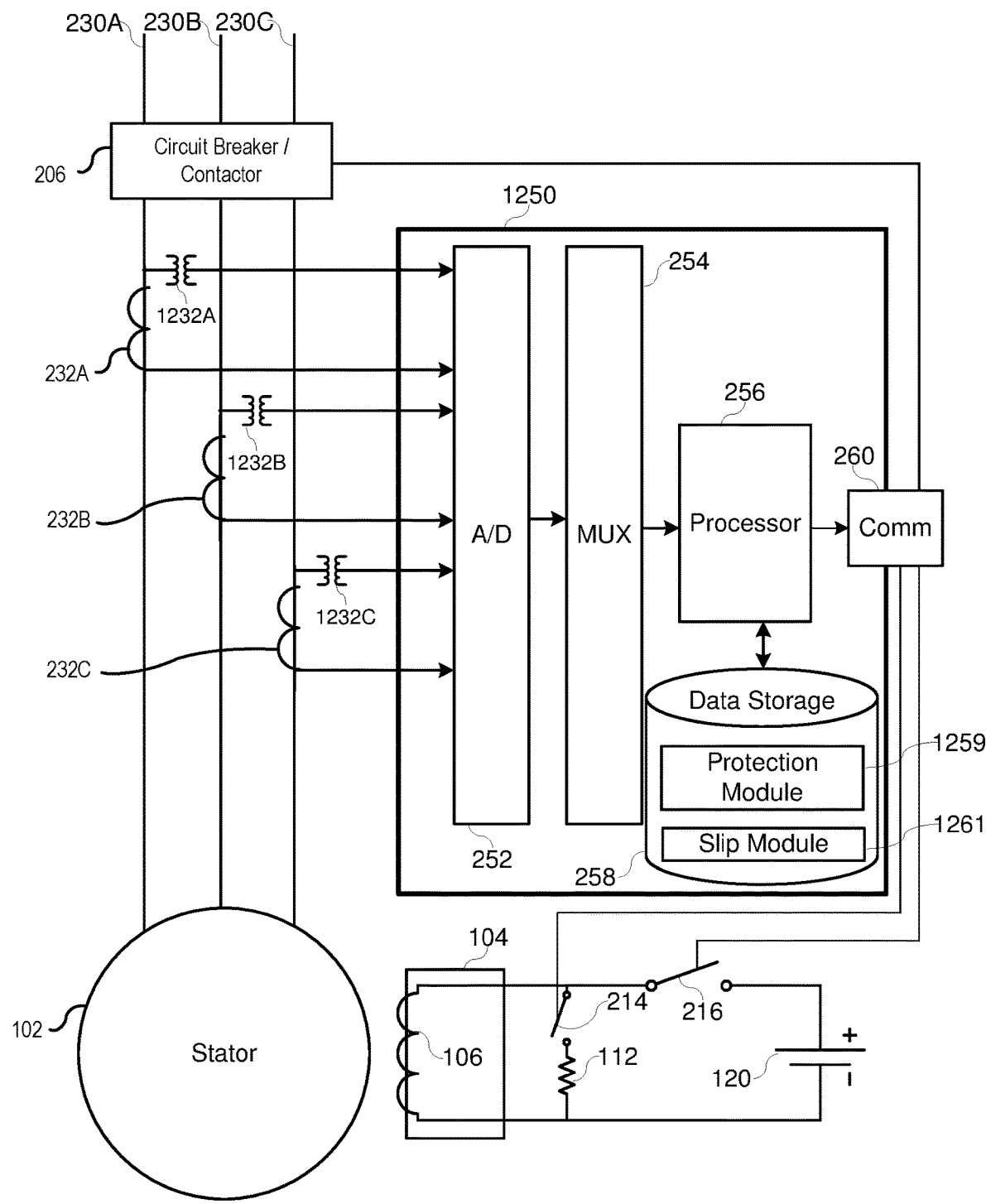
FIG. 12 illustrates a block diagram of a system for providing protection to an electric motor according to various embodiments described herein.

FIG. 12 illustrates a simplified block diagram of a system for monitoring and protecting an electric motor. The system uses IED 1250, which may be similar to IEDs 250 and 850 of FIGS. 2 and 8. In addition to the current signals from CTs 232A, 232B, and 232C, IED 1250 receives voltage signals from potential transformers 1232A, 1232B, and 1232C. Although PTs are illustrated in one configuration, several configurations of PT inputs may be used such as, for example, PTs in a delta configuration. PTs may be used to provide voltage signals to the A/D 252, which may sample the signals to provide digitized analog signals to MUX 254. IED 1250 includes, among other things, a data storage 258 that includes a slip module 1261 and a protection module 1259.

Slip module 1261 may include instructions that, when operated on a processor, may cause the processor to calculate slip using the voltage and current signals as described herein. For example, the instructions may be used to calculate slip according to the embodiments described in conjunction with FIGS. 9-11.

The slip calculation may be made available to the protection module 1259, which may include instructions that, when operated on a processor, may cause the processor to provide protection and/or monitoring of the electric motor. For example, the protection module may monitor the motor during startup to determine if a locked-rotor condition exists. In one embodiment, a locked rotor condition may be determined when the calculated slip remains above a predetermined threshold for a predetermined time during startup. If a locked rotor condition is determined, the protection module may be configured to send a signal to the circuit breaker to open to remove power from the electric motor.

In another embodiment, the protection module may be configured to provide thermal protection using the calculated slip value as described herein. In another embodiment, the protection module may be configured to monitor the electric motor and protect against various operating conditions. For example, the slip value may be used to determine an overspeed condition, underspeed condition, loss of load, overacceleration condition, and the like. When it is determined that the motor is operating outside of predetermined acceptable conditions, the protection module may be configured to cause the IED 1250 to signal the circuit breaker 206 to open, removing power from the electric motor.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A method for providing protection and monitoring to a three-phase electric motor using measurements from a stator of the electric motor, comprising:
    in an intelligent electronic device ("IED"), sampling a plurality of stator currents and voltages to a motor to obtain a plurality of current and voltage values for each of three phases;
    calculating instantaneous power from the plurality of current and voltage values;
    for a first predetermined power frequency, calculate a first magnitude of the instantaneous power at the first predetermined frequency using a first predetermined number of power samples from the instantaneous power;
    for a second predetermined power frequency, calculate a second magnitude of the instantaneous power at the second predetermined frequency using the first predetermined number of power samples;
    determine a maximum magnitude from the first magnitude and the second magnitude;
    calculate a slip value as a ratio of twice a nominal frequency of the motor and one of the first predetermined power frequency and the second predetermined power frequency that corresponds with the determined maximum magnitude;
    determining operating conditions of the electric motor using the calculated slip value; and
    when the operating conditions are outside of predetermined acceptable operating conditions, providing a protection signal to open a circuit breaker to disconnect the electric motor.

2. The method of claim 1 further comprising:
    for a third predetermined frequency, calculate a third magnitude of the instantaneous power using the first predetermined number of power samples; and
    determine the maximum magnitude from the first, second, and third magnitudes.

3. The method of claim 1, further comprising the step of filtering the calculated instantaneous power to remove high-frequency components.

4. The method of claim 1, further comprising the step of down sampling the calculated instantaneous power.

5. The method of claim 1, further comprising the step of filtering the calculated instantaneous power to remove low frequency components.

6. The method of claim 1, further comprising the step of filtering the slip value.

7. The method of claim 1, further comprising the steps of:
    calculating a thermal value of the electric motor using the calculated slip value;
    comparing the calculated thermal value against a predetermined thermal threshold; and
    when the thermal value exceeds the predetermined thermal threshold, providing a protection signal to open a circuit breaker to disconnect the electric motor.

8. The method of claim 1, wherein the power frequency corresponding with the determined maximum magnitude comprises twice a rotational frequency of the motor.

9. The method of claim 1, wherein the first predetermined power frequency and the second predetermined power frequency comprise between twice the nominal rotational frequency of the motor and zero.

10. An intelligent electronic device ("IED") for providing protection and monitoring to a three-phase electric motor, comprising:
    a current input in communication with current transformers in electrical communication with current supplied to stator windings of the motor;
    a voltage input in communication with potential transformers in electrical communication with voltage supplied to stator windings of the motor;
    a processor in communication with the current input and the voltage input, receiving current and voltage data points corresponding with the current and voltage supplied to the stator windings; and,
    a non-transitory computer-readable storage medium in communication with the processor, the non-transitory computer-readable storage medium comprising:
        a slip module configured to calculate slip using the current and voltage data points by:
            calculating instantaneous power from the voltage and current data points;
            for a first predetermined frequency, calculate a first magnitude of the instantaneous power at the first predetermined frequency using a first predetermined number of power samples;
            for a second predetermined frequency, calculate a second magnitude of the instantaneous power at the second predetermined frequency using the first predetermined number of power samples;
            determine a maximum magnitude from the first magnitude and the second magnitude; and
            calculate a slip value as a ratio of twice a nominal frequency of the motor and one of the first predetermined frequency and the second predetermined frequency that corresponds with the maximum magnitude; and
        a protection module configured to determine operating conditions of the electric motor using the calculated slip value, compare the determined operating conditions, and, when the operating conditions are outside of predetermined acceptable operating conditions providing a protection signal to open a circuit breaker to disconnect the electric motor.

11. The apparatus of claim 10, wherein the slip module is further configured to filter the calculated instantaneous power to remove high-frequency components.

12. The apparatus of claim 10, wherein the slip module is further configured to down sample the instantaneous power.

13. The apparatus of claim 10, wherein the slip module is further configured to filter the calculated instantaneous power to remove low frequency components.

14. The apparatus of claim 10, wherein the slip module is further configured to filter the slip value.

15. The apparatus of claim 10, wherein the power frequency corresponding with the determined maximum magnitude comprises twice a rotational frequency of the motor.

16. The apparatus of claim 10, wherein the first predetermined power frequency and the second predetermined power frequency comprise between twice the nominal frequency of the motor and zero.

* * * * *